United States Patent
Miles et al.

(10) Patent No.: US 9,710,091 B2
(45) Date of Patent: Jul. 18, 2017

(54) DISPLAY ELEMENTS

(75) Inventors: Anthony Miles, Bridgend (GB);
Robert Glyn Miles, Bridgend (GB)

(73) Assignee: DST Innovations Limited (GB)

( * ) Notice: Subject to any disclaimer, the term of this patent is extended or adjusted under 35 U.S.C. 154(b) by 379 days.

(21) Appl. No.: 13/583,200

(22) PCT Filed: Feb. 22, 2011

(86) PCT No.: PCT/GB2011/000243
§ 371 (c)(1),
(2), (4) Date: May 16, 2013

(87) PCT Pub. No.: WO2011/101649
PCT Pub. Date: Aug. 25, 2011

(65) Prior Publication Data
US 2013/0222333 A1    Aug. 29, 2013

(30) Foreign Application Priority Data
Feb. 22, 2010   (EP) ..................................... 10275021

(51) Int. Cl.
*G06F 3/045*   (2006.01)
*G06F 3/041*   (2006.01)
*G02B 26/00*   (2006.01)
*H03K 17/96*   (2006.01)

(52) U.S. Cl.
CPC ......... *G06F 3/0414* (2013.01); *G02B 26/001* (2013.01); *G02B 26/004* (2013.01); *G06F 3/0412* (2013.01); *H03K 17/96* (2013.01); *H03K 2217/96046* (2013.01)

(58) Field of Classification Search
CPC ... G06F 3/0412; G06F 3/0414; G02B 26/001; G02B 26/004; H03K 17/96; H03K 2217/96046
USPC .............. 345/44, 156–184; 178/18.01–18, 6; 340/407.1, 407.2; 703/2
See application file for complete search history.

(56) References Cited

U.S. PATENT DOCUMENTS

| 4,875,378 | A | | 10/1989 | Yamazaki et al. |
| 5,184,319 | A | * | 2/1993 | Kramer ............................ 703/5 |
| 5,243,332 | A | * | 9/1993 | Jacobson ........................ 345/44 |
| 7,701,445 | B2 | * | 4/2010 | Inokawa et al. .............. 345/173 |
| 8,596,716 | B1 | * | 12/2013 | Caruso ....................... 297/217.3 |
| 8,665,241 | B2 | * | 3/2014 | Heubel et al. ................ 345/174 |

(Continued)

FOREIGN PATENT DOCUMENTS

| EP | 1133057 A2 | 9/2001 |
| EP | 1199696 A1 | 4/2002 |

(Continued)

OTHER PUBLICATIONS

Examination History received for European Patent Application No. 10275021.3, mailed on Nov. 5, 2014, 166 pages.

(Continued)

*Primary Examiner* — Prabodh M Dharia
(74) *Attorney, Agent, or Firm* — McCarter & English, LLP

(57) ABSTRACT

A electrically actuable display element comprises a substrate, a display surface and an electrically actuable element disposed between the substrate and the display surface and electrically actuable so as to bring a portion thereof into proximity or contact with the display surface and thereby change the display state of the display element.

9 Claims, 5 Drawing Sheets

(56) References Cited

U.S. PATENT DOCUMENTS

| | | |
|---|---|---|
| 2003/0067449 A1* | 4/2003 | Yoshikawa et al. ............ 345/173 |
| 2003/0117371 A1* | 6/2003 | Roberts et al. ................ 345/156 |
| 2004/0179259 A1 | 9/2004 | Fujii et al. |
| 2006/0020469 A1* | 1/2006 | Rast .............................. 704/270 |
| 2009/0002328 A1* | 1/2009 | Ullrich et al. ................. 345/173 |
| 2009/0128503 A1* | 5/2009 | Grant et al. ................... 345/173 |
| 2009/0242281 A1* | 10/2009 | Chou et al. ................. 178/18.03 |
| 2009/0256817 A1* | 10/2009 | Perlin et al. .................. 345/174 |
| 2010/0141407 A1* | 6/2010 | Heubel et al. .............. 340/407.1 |
| 2010/0141410 A1* | 6/2010 | Aono et al. ................. 340/407.2 |
| 2010/0156814 A1* | 6/2010 | Weber et al. ................. 345/173 |
| 2010/0311493 A1* | 12/2010 | Miller et al. ..................... 463/22 |
| 2011/0007035 A1* | 1/2011 | Shai .............................. 345/179 |
| 2013/0155020 A1* | 6/2013 | Heubel et al. ................ 345/174 |

FOREIGN PATENT DOCUMENTS

| | | |
|---|---|---|
| EP | 1643288 A2 | 4/2006 |
| EP | 2128072 A1 | 12/2009 |
| EP | 2360507 A1 | 8/2011 |
| JP | 2001-343599 A | 12/2001 |
| JP | 2002-268099 A | 9/2002 |
| JP | 2007-513392 A | 5/2007 |
| JP | 2009-164035 A | 7/2009 |
| JP | 2009-181197 A | 8/2009 |
| JP | 2013-522701 A | 6/2013 |
| WO | 00/22598 A1 | 4/2000 |
| WO | 2004/106099 A1 | 12/2004 |
| WO | 2006/107174 A2 | 10/2006 |
| WO | 2009/002605 A1 | 12/2008 |

OTHER PUBLICATIONS

Notification of Reason for Refusal received for Japanese Patent Application No. 2012-553400, dispatched on Jan. 27, 2015, 4 pages(English translation only).

* cited by examiner

DISPLAY ELEMENTS

FIELD OF THE INVENTION

The present invention relates to display elements for visual and/or tactile displays, and particularly but not exclusively for touch-sensitive displays.

BACKGROUND OF THE INVENTION

At present, display technologies fall into 5 main types: LCD, plasma, CRT, OLED/LED and projection. These technologies cab be further categorized as follows:

1. Shuttered technology, such as LCD and projection, which allows light to pass in predefined parts of the screen to form the required image.

2. Emissive technology, such as plasma, CRT and OLED/LED that emits light at predefined positions on the screen to render the required image.

Shuttered technologies suffer from poor efficiency, because the light provided by a backlight is partially blocked. Neither technology performs well under bright lighting conditions. Transreflective LCD technologies, which reflect bright illumination, suffer from narrow viewing angles.

For touch-sensitive application, a tech-sensitive layer may be added to the display panel to enable user input using fingers or styli. For tactile applications, a tactile layer may be added that gives a textured or 3D representation.

All of the aforementioned technologies share similar drawbacks for touch-sensitive or tactile applications, in that an additional layer must be added directly over the visual display, therefore, degrading the light output, clarity and contrast of the display panel. Moreover, the additional layer and associated components add to the cost of the display.

Additionally, some touch-sensitive technologies based on row and column sensing in a matrix are only able to detect a single touch at any one time. Other touch-sensitive technologies have poor spatial resolution.

STATEMENT OF THE INVENTION

According to one aspect of the present invention, there is provided an electrically actuable display element according to claim 1.

BRIEF DESCRIPTION OF THE DRAWINGS

There now follows, by way of example only, a detailed description of preferred embodiments of the present invention, with reference to the figures identified below.

DETAILED DESCRIPTION

First Embodiment

A first embodiment of the present invention comprises a visual display screen with touch-sensitive input and tactile output. The visual, touch-sensitive and tactile functions are all provided by the same electrically active material, such as piezoelectric material. As is known in the art, piezoelectric materials generate an electric field in response to mechanical stress and also exhibit the reverse piezoelectric effect, in which the application of an electric field produces stress in the material, resulting in expansion or contraction of the material if not constricted. The stress in the material may be proportional to the electric field. Piezoelectric materials may be ceramics or polymers such as PVDF. The mechanical and electrical properties of the piezoelectric material may be enhanced by providing several layers of the material. As an alternative to piezoelectric materials, other materials may be used which exhibit a shape or size change in response to an electric field, such as carbon nanotube materials currently proposed for use as artificial muscles (see for example 'Giant-Stroke, Superelastic Carbon Nanotube Aerogel Muscles', Aliev A et. al. Science 20 Mar. 2009, VI. 323. no. 5921, pp. 1575-1578).

Figure 1:
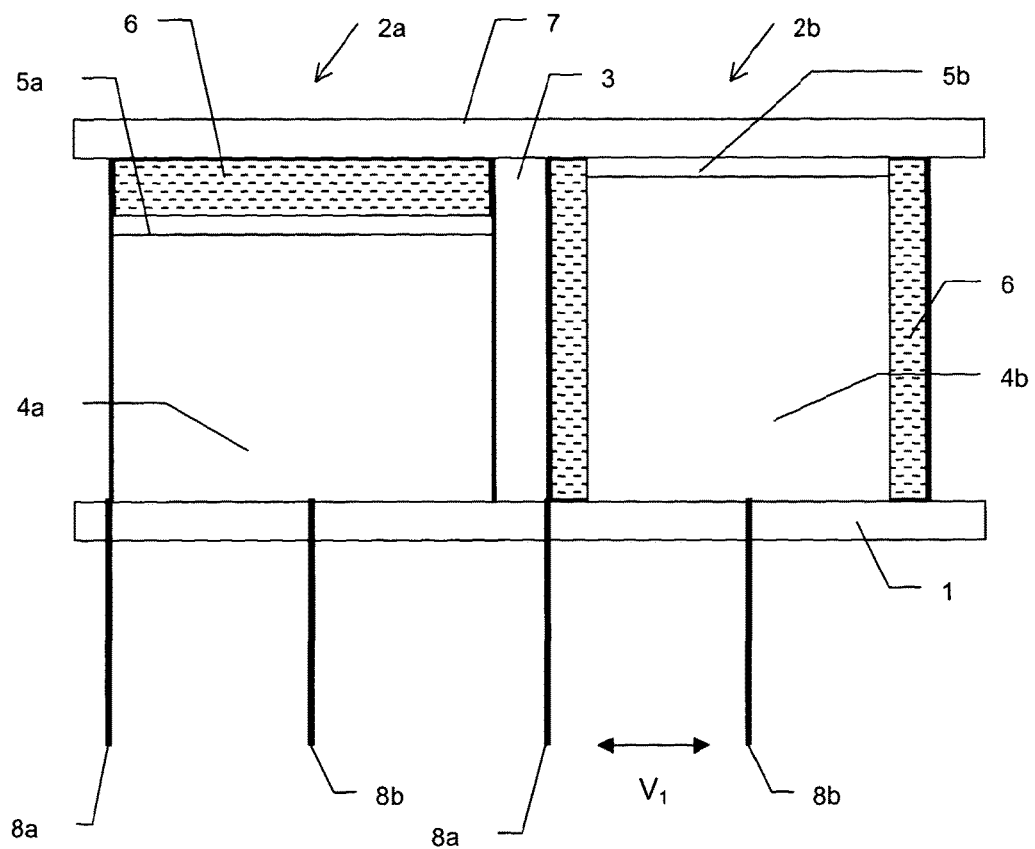
FIG. 1 is a schematic cross section of two adjacent pixels in respective non-actuated and actuated configurations, in a display panel according to the first embodiment of the invention.
Figure 2:
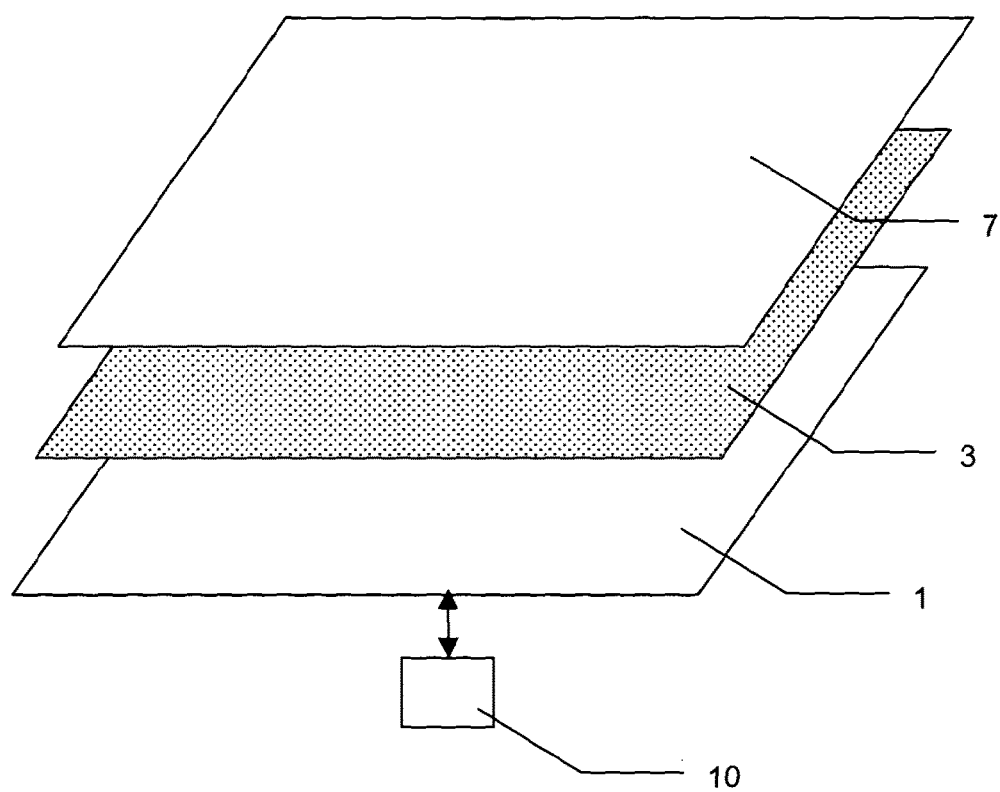
FIG. 2 is a schematic perspective view of the layers of the display panel of the first embodiment.

FIGS. 1 to 4 illustrate the constructional details of a display panel according to a first embodiment of the present invention. The visual display screen of the first embodiment comprises an insulating substrate 1 carrying a matrix of cells 2a, 2b corresponding to the pixel configuration of the display. The cells 2a, 2b may be formed integrally as holes in the surface of the substrate 6, or applied as a separate perforated layer as shown in FIG. 2. In either case, the cells 2a, 2b have walls 3 formed between them. A piezoelectric actuating element 4a, 4b is fitted in each of these cells 2a, 2b, leaving a small void at the top of the cell 2a, 2b.

The insulating substrate 1 carries electrical connections 8a, 8b, for example as a layer formed on one or both sides thereof, which make an independently addressable electrical connection to each piezoelectric actuating element 4a, 4b. A display controller 10 is connected to the electrical connections, to drive the display as described in more detail below.

The upper surface 5a, 5b of each piezoelectric actuating element 4a, 4b is arranged to reflect and/or emit light when illuminated, according to the desired appearance of the corresponding pixel when switched on. In one example, the upper surface 5a, 5b comprises a coloured layer having the desired colour of that pixel. The coloured layer may be fluorescent.

The remaining space within each cell 2a, 2b is filled with a substantially opaque fluid 6, and the cells 2a, 2b are sealed by a substantially transparent front screen 7, fixed to the top ends of the walls 3. Hence, as shown in cell 2a with the pixel Off, the fluid 6 fills the void above piezoelectric actuating element 4a and obscures the upper surface 5a of the piezoelectric actuating element 4a, so that only the fluid 6 is visible through the front screen 7. As shown in cell 2b, the piezoelectric actuating element 4b expands in height and contracts in width when a voltage Vi is applied across it, so that the liquid 6 is expelled from between the upper surface of the piezoelectric actuating element 4b and the front screen 7, and is retained between the walls 3 and the sides of the piezoelectric actuating element 4b. The upper surface is now visible through the front screen and the pixel appears in its On' state. When the voltage is switched off, the piezoelectric actuating element returns to its rest position as shown in cell 2a.

The intensity of the displayed pixel may be controlled by varying the voltage Vl applied to the piezoelectric actuating element 4a, 4b and therefore the thickness of the fluid 6 between the front screen 7 and the upper surface 5a, 5b.

Where the upper surface 5a, 5b is fluorescent, it may be illuminated by ultraviolet (UV) light from a light source forming part of the display screen. For example, the UV light may be introduced into one or more sides of the front screen 7, which acts as a light guide for the UV light.

One pole 8a of the electrical connection to the piezoelectric actuating element 4a, 4b may be made via the fluid 6, which is electrically conductive, for example by including a dissolved salt.

Figure 3:
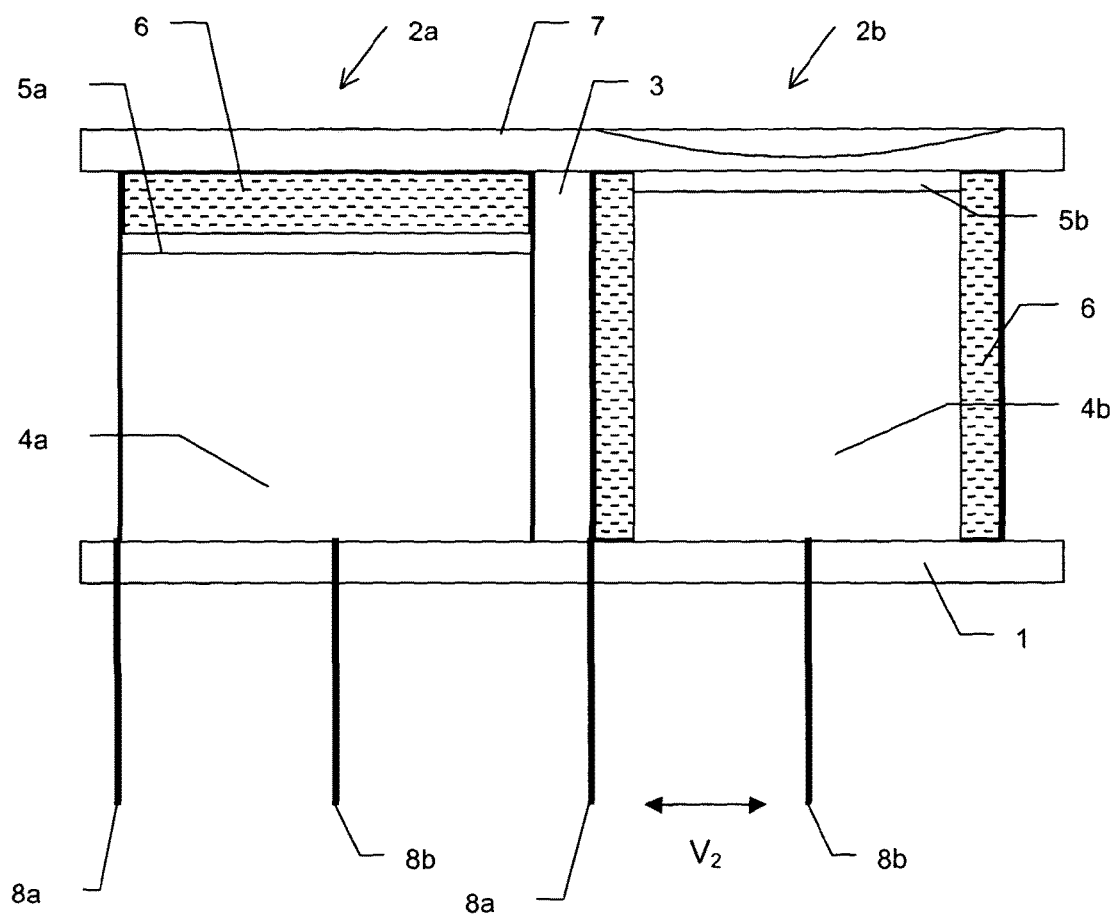
FIG. 3 is a schematic cross section of two adjacent pixels in respective non-touch-sensitive and touch-sensitive configurations, in the display panel of the first embodiment.

A touch-sensitive function of the display of the first embodiment is illustrated in FIG. 3. The front screen 7 is flexible, so that pressure applied to the front screen 7 is transmitted to the piezoelectric actuating element 4b. As a result of the direct piezoelectric effect, a voltage $V_2$ is produced across the electrical connections 8a and 8b and is sensed by the display controller 10, which detects in which individual cells 2a, 2b pressure is applied. Since the detected voltage varies with pressure, the display controller 10 may determine the level of pressure applied to each pixel, thereby enabling a proportional touch-sensitive display. Each pixel effectively acts as a display element and individually addressable pressure transducer. This technology enables many new touch-sensitive display applications.

Where the piezoelectric actuating element 4b is energised by applying the voltage Vi, the voltage $V_2$ will oppose the applied voltage V(. The spacing between the upper surface 5a in the Off state and the front screen 7 may be such that pressure cannot be sensed by the piezoelectric actuating element 4a in its 'off state.

Figure 4:
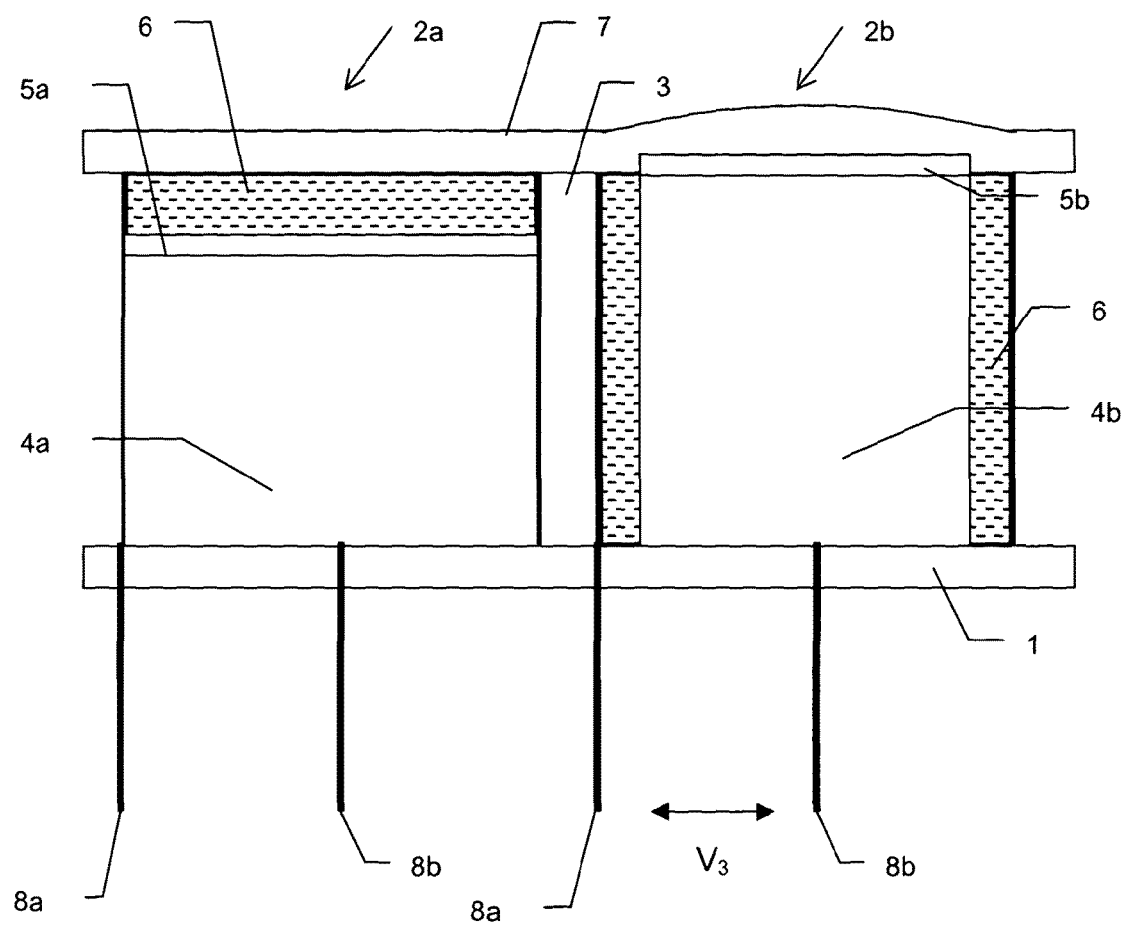
FIG. 4 is a schematic cross section of two adjacent pixels in respective non-tactile and tactile configurations, in the display panel of the first embodiment.

A tactile aspect of the first embodiment is illustrated in FIG. 4. If a voltage $V_3$ higher than voltage Vl is applied, the piezoelectric actuating element 4b expands further and causes outward deformation of the flexible front screen 7 at that point. This deformation causes a tangible bump as well as a visible pixel, so that the displayed image can be felt by a user.

Hence, the first embodiment provides visual, touch-sensitive and/or tactile functions by means of the same piezoelectric element, and the need for additional layers for touch-sensitive and/or tactile functions is avoided. It is not essential that all three of these functions be provided; for example, if the front screen 7 is rigid, only the visual display will be provided.

The piezoelectric elements 4a, 4b may comprise stacked multiple layers of piezoelectric material. The piezoelectric elements 4a, 4b may be arranged in a cantilever bending or beam configuration. The piezoelectric elements 4a, 4b may be arranged in an X-poled or Y-poled configuration.

The display panel may be used as an interactive indicator, point of sale display or other display. The applications of the first embodiment are not limited to flat display screens, but may include for example a 'skin' or surface layer for toys and other products, enhancing the user experience with two way visual and tactile communication between the product and the user.

Second Embodiment

In a second embodiment of the invention, the visual and/or tactile display function is provided by electrically heated thermal expansion rather than piezoelectricity. However, piezoelectric elements may be included for touch-sensitivity. Similar parts to those of the first embodiment are shown with the same reference numerals and their description is not repeated, for brevity.

Figure 5:
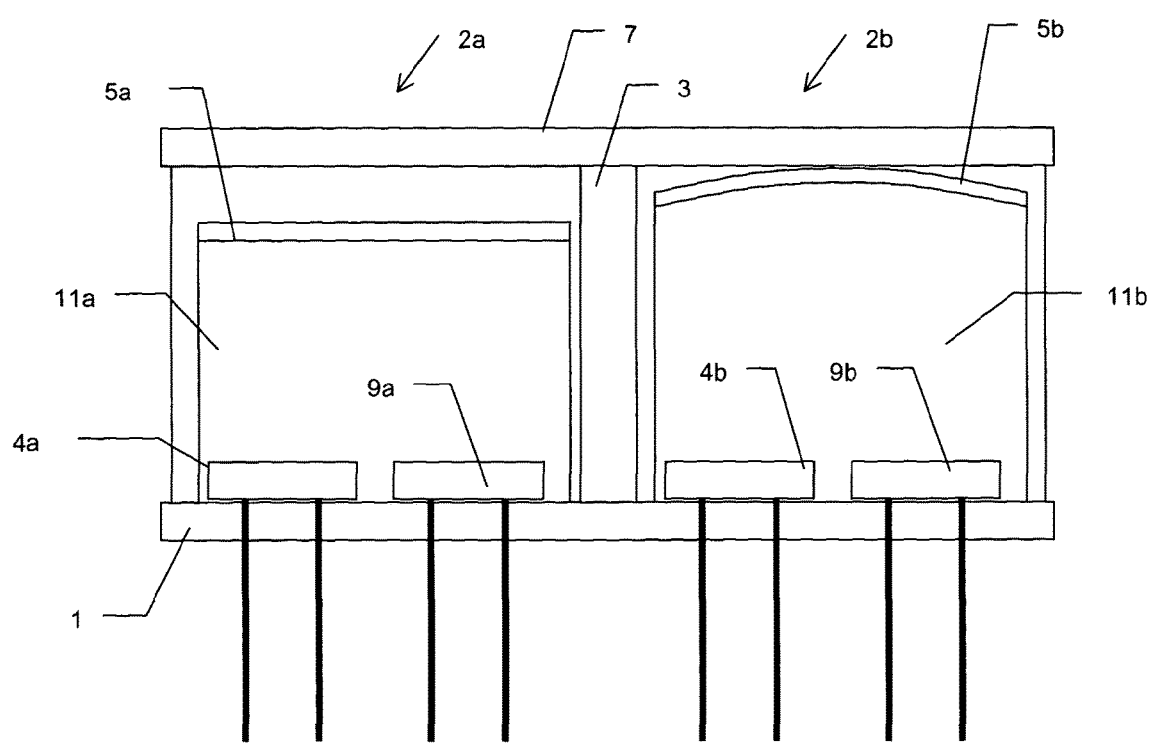
FIG. 5 is a schematic cross section of two adjacent pixels in respective non-actuated and actuated configurations, in a display panel according to a second embodiment of the invention.

The constructional details are shown in FIG. 5. Within each cell 2a, 2b is provided a thermally expanding sac 1 1a, 1 ib containing a fluid that is selectively heated by supply of current to an electric heater 9a, 9b under the control of the display controller 10. The upper surface 5a, 5b is thereby forced upwards into proximity or contact with the front screen 7 and becomes visible, and the pixel is switched On'. When the current supply is switched off, the sac 1 1 a, 1 ib contracts and the pixel is switched Off. In this way, the display controller 10 may independently switch each pixel on and off.

The upper surface 5a, 5b may be flexible, so that the proportion of the upper surface 5a, 5b in contact with the front screen 7 increases as the sac 1 1 a, 1 ib expands. In this way, the intensity of the displayed colour of the pixel may be controlled. The front screen 7 may be flexible, and may be distorted outwardly by the expansion of the sac 1 1 a, 1 ib, thereby providing a tactile representation of the pixel when switched On'.

A piezoelectric sensing element 4a, 4b may be provided within the each sac 1 1 a, 1 1b, and the front screen 7 may be flexible. In this way, when the sac 1 1 a, 1 1b is expanded into contact with the front screen 7, pressure applied to the front screen 7 is hydraulically transferred to the piezoelectric sensing element 4a, 4b, which generates a voltage that is sensed by the display controller 10 and therefore provides independent touch sensitivity for each cell 2a, 2b.

In this embodiment, there is no liquid surrounding the sac 1 1 a, 1 1b, as this would prevent the increase in volume of the sac 1 1 a, 1 ib.

Alternative Embodiments

Alternative electrically actuated means may be provided within each cell 2a, 2b to provide a similar effect to the piezoelectric elements 4a, 4b and/or the thermally expanding sacs H a, 1 ib. For example, micromechanical actuators may be used.

The embodiments described above are illustrative of rather than limiting to the present invention. Alternative embodiments apparent on reading the above description may nevertheless fall within the scope of the invention.

What is claimed is:

1. A display element, comprising an electrically actuable element arranged to provide visual, touch-sensitive and tactile functions, comprising:
   a substrate;
   a substantially transparent, flexible display surface; and
   the electrically actuable element disposed between the substrate and the display surface within a cell containing substantially opaque fluid, and electrically actuable so as to vary a separation between a portion of the electrically actuable element and the display surface and thereby vary a thickness of fluid therebetween so as to change a display state of the display element;
   wherein the electrically actuable element is arranged to sense pressure on the display surface when brought into contact therewith; and
   wherein the portion of the electrically actuable element is arranged to be brought into proximity or contact with the display surface so as to distort the display surface to provide tactile output.

2. The display element of claim 1, wherein the fluid is electrically conductive, and arranged to provide an electrical contact to the electrically actuable element.

3. The display element of claim 1, wherein the electrically actuable element includes a piezoelectric element.

4. The display element of claim 1, wherein the electrically actuable element includes a thermally expandable element and a heater.

5. The display element of claim 1, wherein the portion of the electrically actuable element is optically reflective.

6. The display element of claim 1, wherein the portion of the electrically actuable element is fluorescent.

7. The display element of claim 6, wherein the display surface is arranged to guide ultraviolet light onto said portion.

8. The display element of claim 1, wherein the electrically actuable element is arranged to detect a level of pressure applied thereto.

9. A display system to provide visual, touch-sensitive and tactile functions, comprising:

an array of individually electrically addressable display elements;

a substrate; and a substantially transparent, flexible display surface;

wherein each electrically actuable element is disposed between the substrate and the display surface within a respective cell containing substantially opaque fluid, and electrically actuable so as to vary a separation between a portion of the electrically actuable element and the display surface and thereby vary a thickness of fluid therebetween so as to change a display state of the display element;

wherein each electrically actuable element is arranged to sense pressure on the display surface when brought into contact therewith; and wherein the portion of the each electrically actuable element is arranged to be brought into proximity or contact with the display surface so as to distort the display surface to provide tactile output.

* * * * *